(12) United States Patent
Ko

(10) Patent No.: US 6,667,643 B2
(45) Date of Patent: Dec. 23, 2003

(54) DELAY LOCKED LOOP WITH MULTI-PHASES

(75) Inventor: Myeong-Iyong Ko, Kwacheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/256,449

(22) Filed: Sep. 27, 2002

(65) Prior Publication Data
US 2003/0076142 A1 Apr. 24, 2003

(30) Foreign Application Priority Data

Sep. 28, 2001 (KR) ........................................ 2001-60555

(51) Int. Cl.$^7$ ................................................. H03L 7/06
(52) U.S. Cl. ........................................ 327/158; 327/161
(58) Field of Search ................................. 327/147, 148, 327/149, 156, 157, 158, 161

(56) References Cited

U.S. PATENT DOCUMENTS 5,663,665 A    9/1997  Wang et al. ..................... 327/3
5,994,933 A  * 11/1999  Yamanaka et al. ........... 327/158
6,304,116 B1 * 10/2001  Yoon et al. .................. 327/258

* cited by examiner

Primary Examiner—Terry D. Cunningham
Assistant Examiner—Quan Tra
(74) Attorney, Agent, or Firm—Mills & Onello LLP

(57) ABSTRACT

A delay locked loop circuit includes a delay unit for receiving an input clock signal, generating an output clock signal whose phase lags that of the input clock signal, and generating multiple delay signals having differently delayed phases in response to the input clock signal; a harmonic lock preventing unit for receiving the input clock signal and the multiple delay signals, outputting a $1^{st}$ signal and a $2^{nd}$ signal, comparing the phases of the input clock signal and the multiple delay signals, and generating the $1^{st}$ signal or the $2^{nd}$ signal depending on the comparison result; an electric charge pump for receiving the $1^{st}$ signal and the $2^{nd}$ signal, generating a phase control signal, and making the voltage of the phase control signal higher or lower than a pre-defined voltage in response to the $1^{st}$ signal and the $2^{nd}$ signal; a filter for eliminating AC included in the phase control signal and transmitting the filtered signal to the delay unit; and start-up circuits for feeding a $1^{st}$ voltage to the electric charge pump in the initial state before the output clock signal is generated and making the electric charge pump provide a $2^{nd}$ voltage to the delay unit; wherein the delay unit provides a delay locked circuit that adjusts the phases of the output clock signal and the multiple delay signals in response to the phase control voltage.

16 Claims, 7 Drawing Sheets (a)

(b)

(c)

(d)

(e)

DELAY LOCKED LOOP WITH MULTI-PHASES

BACKGROUND OF THE INVENTION

1. Field of the Invention

The present invention relates to a Delay Locked Loop (DLL), and more particularly, to a DLL with multi-phases.

2. Description of the Related Art

A semiconductor device, which processes signals at high speed with a built-in memory, uses a Phase Locked Loop (PLL) or a Delay Locked Loop (DLL) in order to synchronize input/output data with a system clock. The DLL features less jitter and is simpler and more reliable than the PLL. However, the DLL is disadvantageous in that it has limited phases when compared to the PLL. Recently, various methods to overcome the disadvantage of the DLL have been studied. Since the DLL operates reliably even in the digital block where power noise is serious, it has had a wide range of applications.

FIG. 1 is a block diagram of an existing DLL. Referring to FIG. 1, the existing DLL 101 includes a phase comparator 111, an electric charge pump 121, a filter 131 and a delay element 141. The phase comparator 111 compares the phases of an input clock signal (CLKIN) and an output clock signal (CLKOUT). Then, the phase comparator outputs the phase difference as the $1^{st}$ signal (UP) or the $2^{nd}$ signal (DN). The electric charge pump 121 increases or decreases the output voltage (V1) depending on the $1^{st}$ signal (UP) or the $2^{nd}$ signal (DN). The filter 131 eliminates AC included in the output voltage (V1). The delay element 141 reduces or extends the delay time of the output clock signal (CLKOUT) depending on the output voltage of the filter 131 to be synchronized with or frequency-adjusted with the input clock signal (CLKIN).

In the existing DLL 101, the limited phase capture range may cause harmonic lock.

FIG. 2A shows the output clock signal of the DLL 101 shown in FIG. 1 synchronized with the input clock signal (CLKIN). The rising edge (r1) of the output clock signal (CLKOUT) is synchronized with the rising edge (r2) of the input clock signal (CLKIN) after N clock periods (TN).

FIG. 2B shows the output clock signal (CLKOUT) shown in FIG. 1 in a harmonic lock state. The rising edge (r3) of the output clock signal (CLKOUT) is synchronized with the rising edge (r4) of the input clock signal (CLKIN) after N clock periods (TN). Even though the rising edge (r3) of the output clock signal (CLKOUT) is synchronized with the rising edge of the input clock signal (CLKIN) after N clock periods, the output clock signal is in a frequency-varied harmonic lock state which is an abnormal state. However, the phase comparator 111 judges the state as normal. This is a problem of the existing DLL 101.

IEEE J. Solid-state Circuits, vol 32, pp.1683–1692, Nov 1997 specifies a method of starting the delay line with the minimum delay in the initial operation of the DLL, as a solution to harmonic lock. However, the method specified in the publication can only address harmonic lock in part, and is not a fundamental solution to harmonic lock.

U.S. Pat. No. 5,663,665 discloses another method to resolve harmonic lock. The phase discriminator of the '665pPatent detects whether the rising edge of the signal of the last tab of the delay element is the same as that of one signal of the middle tabs. If the phase discriminator detects that case, it judges that harmonic lock is present, and prevents harmonic lock by adjusting the delay speed. However, if none of the rising edges of the signals of the middle tabs is the same as the rising edge of the signal of the last tab, the phase discriminator defined in the '665 patent cannot detect the phase difference and harmonic lock cannot be prevented.

In addition, in some cases, the DLL user requires a randomly delayed clock signal. However, the existing DLL delays the output clock signal only for a pre-defined time.

SUMMARY OF THE INVENTION

To solve the above-described problems, it is a first object of the present invention to provide a Delay Locked Loop (DLL) that completely prevents harmonic lock.

It is a second object of the present invention to provide a DLL that can selectively output randomly delayed clock signals.

In accordance with the present invention, there is provided a delay locked loop comprising: a delay unit for receiving an input clock signal, generating an output clock signal whose phase lags that of the input clock signal, and generating multiple delay signals having different phase delays in response to the input clock signal; a harmonic lock preventing unit for receiving the input clock signal and the multiple delay signals, comparing the phases of the input clock signal and the delay signals, generating a $1^{st}$ signal or a $2^{nd}$ signal depending on the comparison result, and outputting the $1^{st}$ signal or the $2^{nd}$ signal; an electric charge pump for receiving the $1^{st}$ signal and the $2^{nd}$ signal, generating a phase control signal, and making the voltage of the phase control signal higher or lower than a pre-defined voltage in response to the $1^{st}$ signal and the $2^{nd}$ signal; a filter for eliminating AC included in the phase control signal and transmitting the filtered signal to the delay unit; and start-up circuits for feeding a $1^{st}$ voltage to the electric charge pump in the initial state before the output clock signal is generated and making the electric charge pump provide a $2^{nd}$ voltage to the delay unit, wherein the delay unit provides a delay locked circuit that adjusts the phases of the output clock signal and the multiple delay signals in response to the phase control voltage.

Preferably, the delay unit includes: multiple delay elements connected in series for delaying the input clock signal, and outputting the output clock signal and the multiple delay signals; and a bias unit for controlling the delay amount of the multiple delay elements depending on the voltage of the output signal of the filter. Preferably, the multiple delay signals are output from specific elements of the multiple delay elements.

Preferably, the harmonic lock preventing unit includes: multiple phase detectors for comparing two adjacent signals out of the input clock signal and multiple delay signals, activating the $1^{st}$ signal if the phase is found to lag and activating the $2^{nd}$ signal if the phase is found to lead, and receiving two adjacent signals out of the input clock signal and the multiple delay signals; a $1^{st}$ NOR gate and a $2^{nd}$ NOR gate for each receiving the outputs of half of the multiple phase detectors; an OR gate for receiving the outputs of the $1^{st}$ NOR gate and the $2^{nd}$ NOR gate and outputting the $1^{st}$ signal; and an AND gate for receiving the outputs of the $1^{st}$ NOR gate and the $2^{nd}$ NOR gate and outputting the $2^{nd}$ signal. Preferably, the phase detectors include: a $1^{st}$ delay flip-flop for receiving the power voltage and the input clock signal or the $1^{st}$ delay signal and generating the output of the phase detector; a $2^{nd}$ delay flip-flop for receiving the power voltage and the $2^{nd}$ delay signal which has a phase closest to that of the $1^{st}$ delay signal; and a $2^{nd}$ NAND gate for receiving the outputs of the $1^{st}$ delay flip-flop and the $2^{nd}$ delay flip-flop, and providing the outputs to the $1^{st}$ delay flip-flop and the $2^{nd}$ delay flip-flop. In addition, preferably, the electric charge pump makes the voltage of the phase control signal higher than the pre-defined voltage if the $1^{st}$ signal is activated, and makes the voltage of the phase control signal lower than the pre-defined voltage if the $2^{nd}$ signal is activated. The electric charge pump includes a $1^{st}$ transistor which outputs a power voltage and is gated by the output of the start-up circuit.

Preferably, if the phase control voltage becomes higher than the pre-defined voltage, the phases of the output clock signal and multiple delay signals are advanced. If the phase control voltage becomes lower than the pre-defined voltage, the phases of the output clock signal and multiple delay signals are delayed. Preferably, the start-up circuit includes: a $1^{st}$ delay flip-flop for receiving the input clock signal and the output clock signal; and a $2^{nd}$ delay flip-flop for receiving the outputs of the $1^{st}$ delay flip-flop and the output clock signal and generating the output of the start-up circuit. Preferably, if the output clock signal is logic low in the initial state before the output clock signal is generated, the start-up circuit outputs the logic low, the $1^{st}$ transistor is turned on and the power voltage is provided to the filter so that the output clock signal can be quickly synchronized with the input clock signal.

In accordance with a second aspect of the present invention, there is provided a delay locked loop comprising: a delay unit for receiving an input clock signal, generating an output clock signal whose phase lags the input clock signal, and generating $1^{st}$ multiple delay signals and $2^{nd}$ multiple delay signals having different phase delays in response to the input clock signal; a harmonic lock preventing unit for receiving the input clock signal and the $1^{st}$ multiple delay signals, outputting a $1^{st}$ signal and a $2^{nd}$ signal, comparing the phases of the input clock signal and the $1^{st}$ multiple delay signals, and generating the $1^{st}$ signal or the $2^{nd}$ signal depending on the comparison result; an electric charge pump for receiving the $1^{st}$ signal and the $2^{nd}$ signal, generating a phase control signal, and making the voltage of the phase control signal higher or lower than a pre-defined voltage in response to the $1^{st}$ signal and the $2^{nd}$ signal; a filter for eliminating AC included in the phase control signal and transmitting the filtered signal to the delay unit; and a decoder for decoding a received address signal and providing the decoded signal to the delay unit, wherein the delay unit selectively outputs some of the $2^{nd}$ multiple delay signals in response to the decoded signal and provides a delay locked circuit that adjusts the phases of the output clock signal and the $1^{st}$ multiple delay signals in response to the output signal of the filter.

Preferably, the delay unit includes: multiple delay elements connected to the input clock signal in series; a bias unit for controlling the delay amount of the multiple delay elements depending on the voltage of the output signal of the filter; and multiple switching elements, connected respectively to the outputs of the delay elements and switched by the decoded signal, for outputting the $2^{nd}$ multiple delay signals, wherein the $1^{st}$ multiple delay signals are output by specific elements of the delay elements. It is preferable that the switching elements are transmission gates.

Preferably, the number of $2^{nd}$ multiple delay signals is larger than the number of $1^{st}$ multiple delay signals.

In accordance with another aspect of the present invention, there is provided a delay locked loop comprising: a delay unit for receiving an input clock signal, generating an output clock signal whose phase lags the input clock signal, and generating $1^{st}$ and $2^{nd}$ multiple delay signals having different phase delays in response to the input clock signal; a harmonic lock preventing unit for receiving the input clock signal and the $1^{st}$ multiple delay signals, outputting a $1^{st}$ signal and a $2^{nd}$ signal, comparing the phases of the input clock signal and the $1^{st}$ multiple delay signals and generating the $1^{st}$ signal or the $2^{nd}$ signal depending on the comparison result; an electric charge pump for receiving the $1^{st}$ signal and the $2^{nd}$ signal, generating a phase control signal, and making the voltage of the phase control signal higher or lower than a pre-defined voltage in response to the $1^{st}$ signal and the $2^{nd}$ signal; a filter for eliminating AC included in the phase control signal and transmitting the filtered signal to the delay unit; start-up circuits for feeding a $1^{st}$ voltage to the electric charge pump in the initial state before the output clock signal is generated and making the electric charge pump provide a $2^{nd}$ voltage to the delay unit; and a decoder for decoding a received address signal and providing the decoded signal to the delay unit, wherein the delay unit selectively outputs $2^{nd}$ multiple delay signals in response to the decoded signal and adjusts the phases of the output clock signal and $1^{st}$ multiple delay signals in response to the output signal of the filter. The present invention can prevent harmonic lock.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
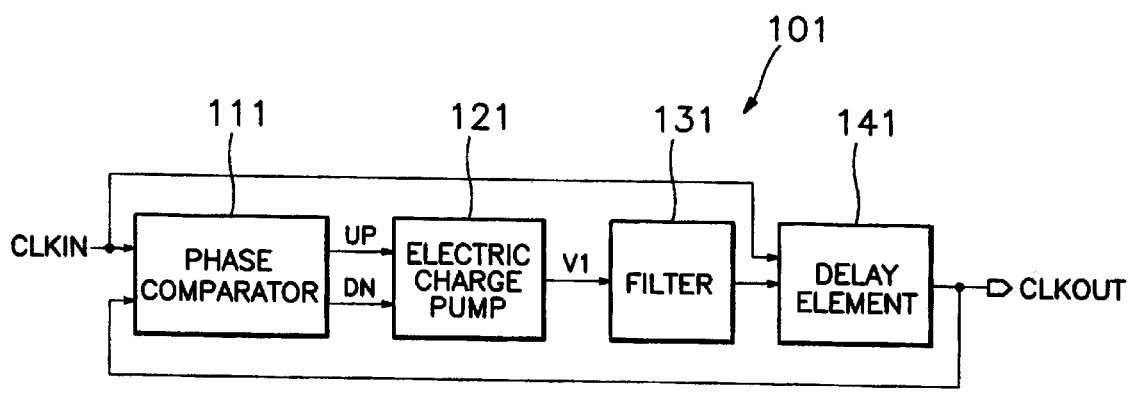
FIG. 1 is a block diagram of an existing Delay Locked Loop (DLL).
Figure 2A:
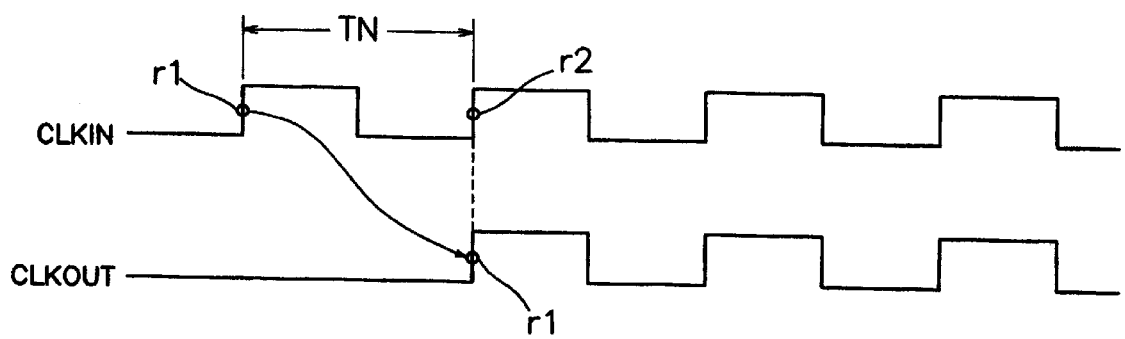
FIGS. 2A and 2B show the output clock of the DLL shown in FIG. 1, synchronized with the input clock, and in a harmonic lock state, respectively.
Figure 2B:
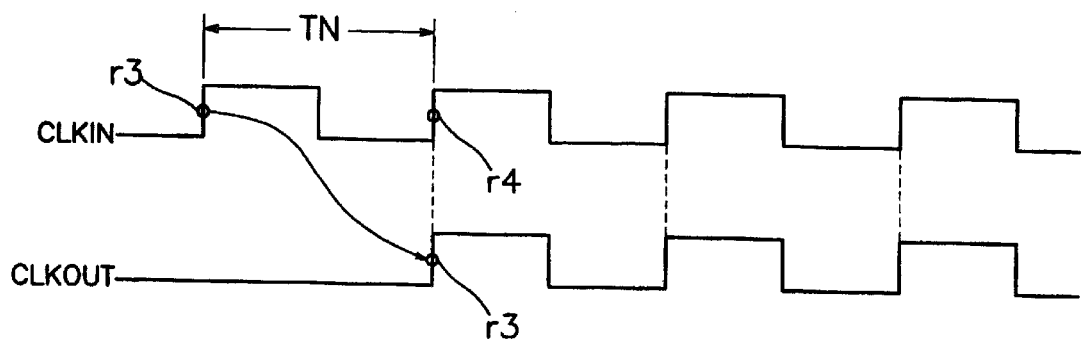
Figure 3:
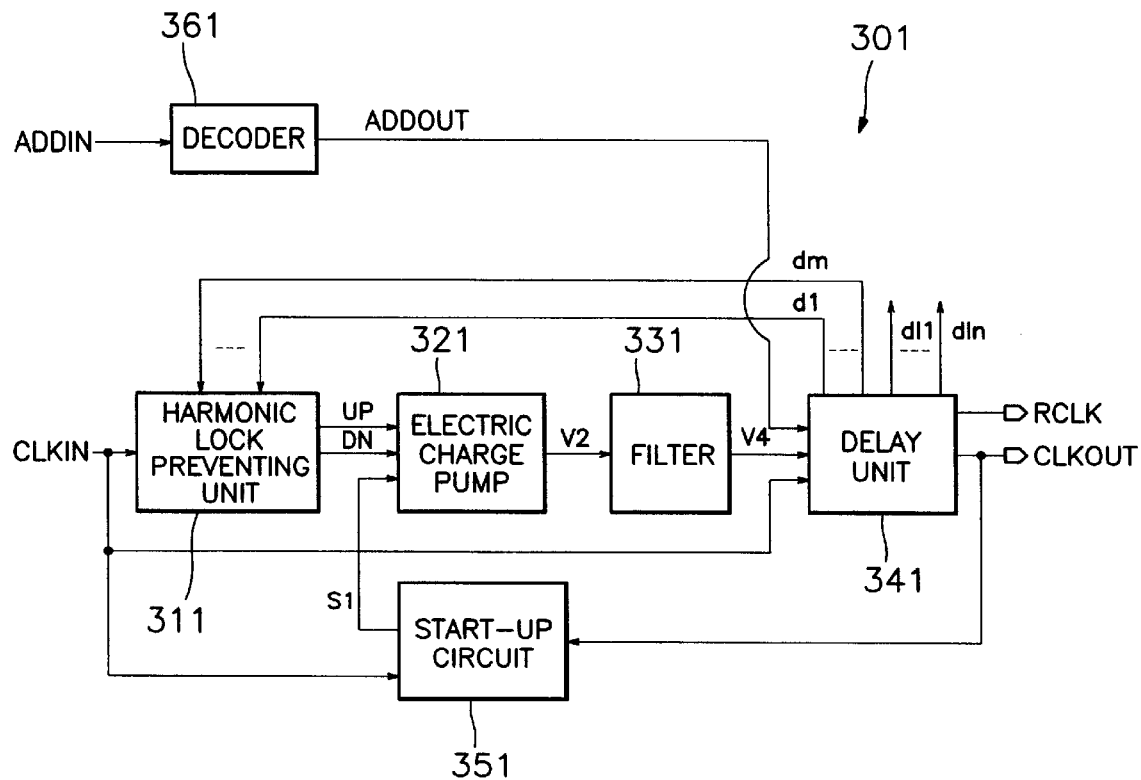
FIG. 3 is a block diagram of the DLL according to a preferred embodiment of the present invention.

FIG. 3 is a block diagram of a Delay Locked Loop (DLL) according to the preferred embodiment of the present invention. Referring to FIG. 3, the DLL 301 includes a harmonic lock preventing unit 311, an electric charge pump 321, a filter 331, a delay unit 341, a start-up circuit 351 and a decoder 361.

The delay unit 341 delays the input clock signal (CLKIN) for a pre-defined time and outputs the output clock signal (CLKOUT). In addition, the delay unit 341 outputs $1^{st}$ multiple delay signals (d1~dm) and $2^{nd}$ multiple delay signals (dl1~din) whose phase lags that of the input clock signal (CLKIN) and leads that of the output clock signal (CLKOUT). The $1^{st}$ multiple delay signals (d1~dm) are transmitted to the harmonic lock preventing unit 311. The delay unit 341 is connected to the decoder 361, and outputs at least one delay signal out of the $2^{nd}$ multiple delay signals (dl1~din) depending on the output signals (ADDOUT) of the decoder 361. Since the delay unit 341 includes a Voltage Controlled Delay Line (VCDL), the delay time of the output clock signal (CLKOUT), the $1^{st}$ multiple delay signals (d1~dm) and the $2^{nd}$ multiple delay signals (dl1~din) are adjusted by a signal (V4) output from the filter 331.

The decoder 361 decodes the received address signal (ADDIN) and outputs the decoded address signal (ADDOUT).

Since the delay unit 341 outputs the $2^{nd}$ multiple delay signals (dl1~din) having different phases depending on the decoded address signal (ADDOUT), the DLL user can choose to use dl1~din, as well as the output clock signal (CLKOUT) to then output the chosen signal as a clock signal RCLK for another purpose of use.

The start-up circuit 351 receives the input clock signal (CLKIN) and the output clock signal (CLKOUT) and sets the initial voltage of signal (V4) which is provided by the filter 331 to the delay unit 341 before the input clock signal (CLKIN) input to the delay unit 341 is output from the delay unit 341. The input clock signal (CLKIN) has a large phase difference from the output clock signal (CLKOUT) output in the initial state before the input clock signal (CLKIN) input to the delay unit 341 in a coarse mode during power-on is output as the output clock signal (CLKOUT) from the delay unit 341. In the initial power-on state in which supply of the power voltage to a device having the DLL 301 starts, the output clock signal (CLKOUT) is logic low, and the output clock signal (CLKOUT) of the initial logic low level resets the start-up circuit 351, thereby making the output of the flipflops 411 and 412 go low. Accordingly, the PMOS transistor 431 is turned on and the voltage of the signal (V4) increases fast to be a predetermined voltage level. Thus, in the initial power-on state, the output clock signal (CLKOUT) is quickly synchronized with the input clock signal (CLKIN).

After the coarse mode ends, the DLL 301 operates in a fine mode to accurately match phase. The DLL of the present invention 301 prevents harmonic lock in fine mode and matches phase accurately.

Figure 6:
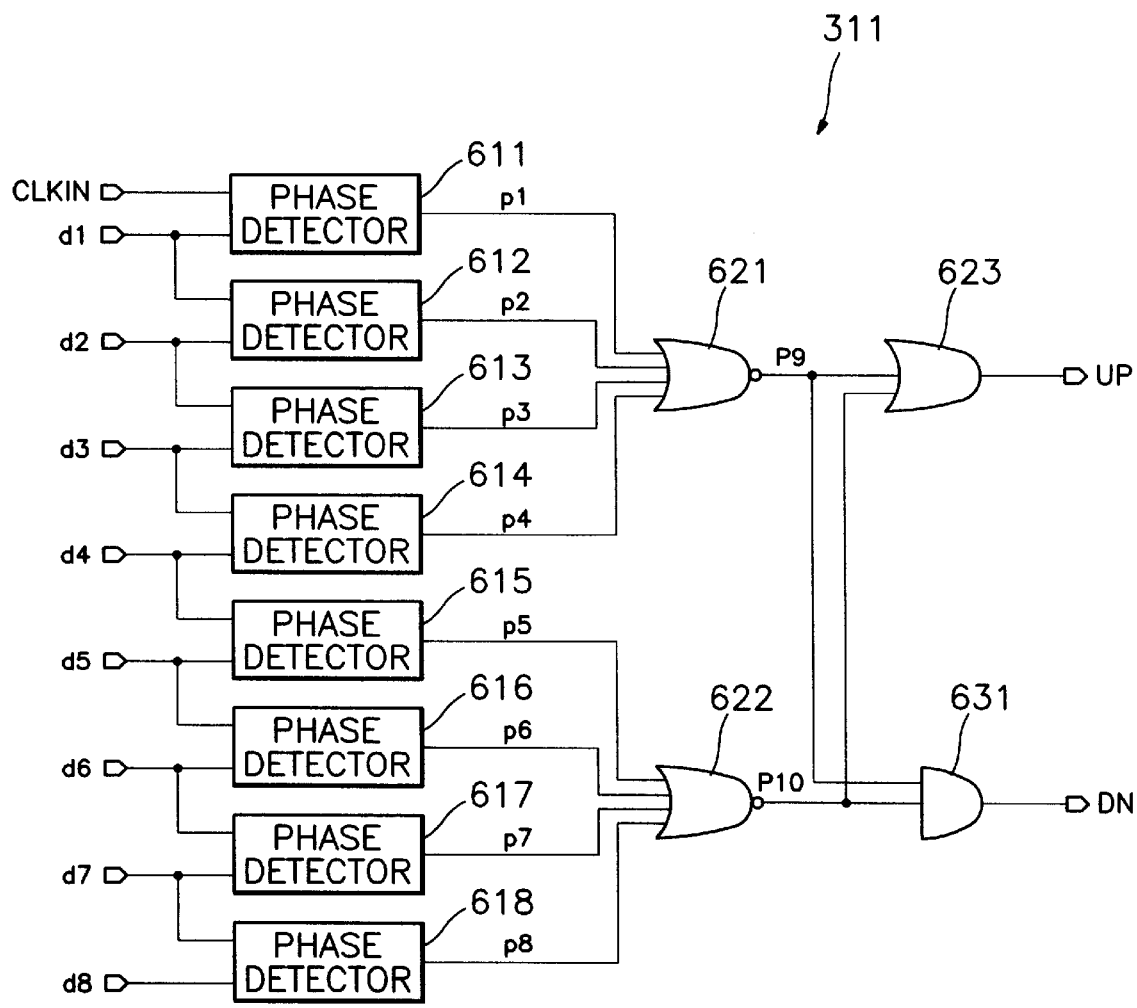
FIG. 6 is a circuit diagram of a harmonic lock preventing unit shown in FIG. 3.

The harmonic lock preventing unit 311 receives the $1^{st}$ multiple delay signals (d1~dm) output from the delay unit 341 and outputs $1^{st}$ signals (UP) and $2^{nd}$ signals (DN). The harmonic lock preventing unit 311 compares the phases of adjacent delay signals out of the $1^{st}$ multiple delay signals (d1~dm). If the phase difference of the delay signals exceeds a pre-defined value, the harmonic lock preventing unit activates the $1^{st}$ signal (UP) or the 2nd signal (DN). The harmonic lock preventing unit 311 operates as follows. In a phase detector (611 shown in FIG. 7A), when the input clock signal (CLKIN) is activated to logic high, the output (P1) goes logic high. Then the input clock signal (CLKIN) has a predetermined delay time at the delay unit 341 so that a signal (d1) of a high level is produced. The output (P1) of the phase detector 611 is transitioned into logic low by the signal (d1). The phase detector 611 is driven by outputs (d1~dm) of the delay unit 341, as shown in FIG. 6, to thus prevent a harmonic lock, which is a problem occurring to a delay lock loop 301. This is possible because the harmonic lock preventing unit 311 shown in FIG. 6 which features the present invention, generates the $1^{st}$ or $2^{nd}$ signal (UP or DN) to be fed back within one period when the outputs (d1~dm) of the delay unit 341 is larger or smaller than the period of the input clock signal (CLKIN) as a reference signal.

The electric charge pump 321 receives the $1^{st}$ signal (UP) and the $2^{nd}$ signal (DN), and generates a phase control signal (V2). If the $1^{st}$ signal (UP) is activated, the voltage of the phase control signal (V2) rises. If the $2^{nd}$ output signal (DN) is activated, the voltage of the phase control signal (V2) falls.

The filter 331 removes AC signals included in the phase control signal (V2) and sends the signal (V4) having pure DC signals to the delay unit 341.

As described above, the harmonic lock preventing unit 311 detects the phase differences between the $1^{st}$ multiple delay signals (d1~dm) output from the delay unit 341. The harmonic lock preventing unit 311 detects whether the phase differences exceed a pre-defined range and accurately synchronizes the output clock signal (CLKOUT) with the input clock signal (CLKIN). Therefore, the output clock signal (CLKOUT) is prevented from entering the harmonic lock state.

Figure 4:
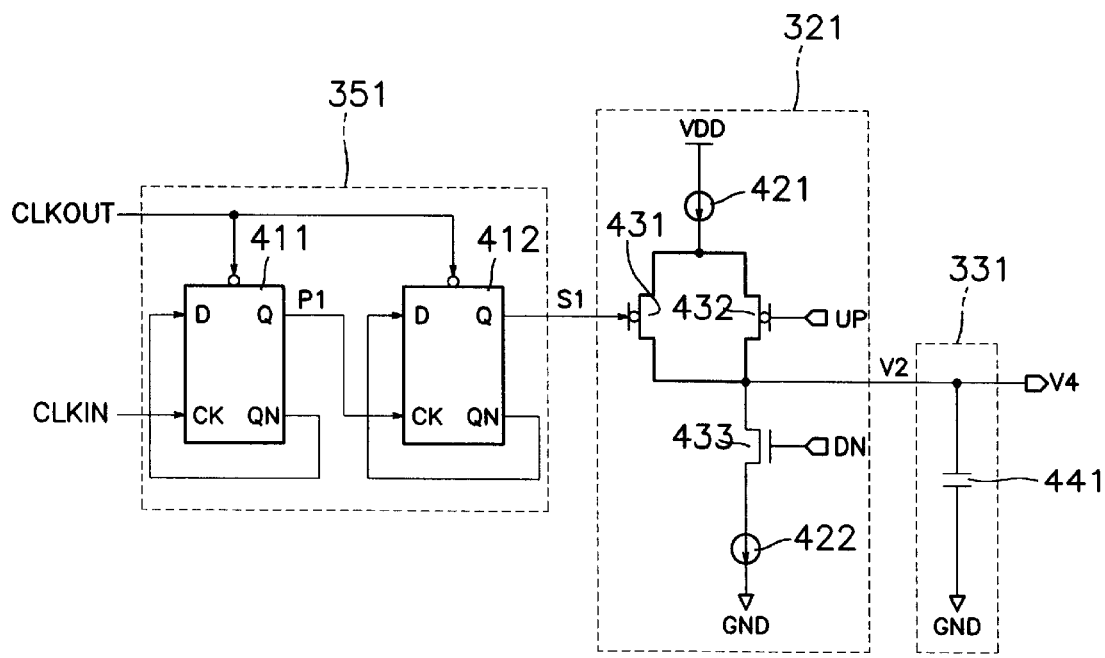
FIG. 4 is a circuit diagram showing a start-up circuit, an electric charge pump and a filter shown in FIG. 3.

FIG. 4 shows embodiments of a start-up circuit 351, an electric charge pump circuit 321 and a filter circuit 331.

Referring to FIG. 4, the start-up circuit 351 includes a $1^{st}$ delay flip-flop 411 and a $2^{nd}$ delay flip-flop 412.

The $1^{st}$ delay flip-flop 411 receives an input clock signal (CLKIN) and the output clock signal (CLKOUT), and generates a clock signal (P1) whenever the level of the input clock signal (CLKIN) increases from logic low to logic high. The $1^{st}$ delay flip-flop 411 outputs the clock signal (P1) generated as a result of the division by two of the input clock signal (CLKIN). A $2^{nd}$ delay flip-flop 412 outputs the signal (S1) generated as a result of the division by four of the clock signal (P1) output by the $1^{st}$ delay flip-flop 411. Reset terminals of the $1^{st}$ delay flip-flop 411 and the $2^{nd}$ delay flip-flop 412 receive the output clock signal (CLKOUT). If the output clock signal (CLKOUT) is logic high, the two flip-flops 411 & 412 operate normally. If the output clock signal (CLKOUT) is logic low, the flip-flops 411 & 412 are reset. If the $2^{nd}$ delay flip-flop 412 is reset, the start-up circuit 351 outputs the signal (S1) as a logic low signal irrespective of the input. That is, if the output clock signal (CLKOUT) is logic low in the initial state of the delay unit 341, the start-up circuit 351 outputs the signal (S1) at a logic low level. If the delay lock loop 301 operates normally, that is, if the periods of the input clock signal (CLKIN) and the output clock signal (CLKOUT) are equal to each other, the output clock signal (CLKOUT) is always synchronized with the input clock signal (CLKIN) of logic high, to thus reset the signal (S1), so that the PMOS transistor 431 will never be driven. Thus, after the normal operation, the start-up function is stopped.

The electric charge pump 321 includes a $1^{st}$ PMOS transistor 431 and a $2^{nd}$ PMOS transistor 432, a $1^{st}$ current source 421, and a $2^{nd}$ current source 422, and outputs the phase control signal (V2). The $1^{st}$ NMOS transistor 433 is turned on and outputs the constant current generated from the $1^{st}$ current source 421 as the phase control signal (V2), when the output of the start-up circuit 351 is logic low. The $2^{nd}$ PMOS transistor 432 outputs the constant current and increases the voltage of the phase control signal (V2) when the 1st signal (UP) is logic low. The 1st NMOS transistor 433 reduces the voltage of the phase control signal (V2) through a constant current source 422 when the 2nd signal (DN) is logic high.

As described above, the electric charge pump 321 makes the voltage of the phase control signal (v2) higher than a pre-defined voltage when the 1st signal (up) is activated to logic low and make the voltage of the phase control signal (V2) lower than a predetermined voltage when the 2nd signal (UP) is activated to logic high.

The filter 331 includes a capacitor 441, and eliminates AC included in the phase control signal (v2) to provide the signal (V4) having a pure DC signal to the delay unit 341. In addition, the capacitor 441 is charged to a certain voltage and the signal (V4) is maintained at a pre-defined voltage. The voltage increase or decrease according to the 1st or 2nd signal (UP or DN) generated due to a phase difference and the delay time of the delay unit 341 is varied.

As described above, the start-up circuit 351 outputs logic low in the initial state before the output clock signal (CLKOUT) is normally output. Then, the 1st PMOS transistor 431 is turned on and the power voltage (vdd) is provided to the delay unit 341 through the filter 331 so that the output clock signal (CLKOUT) can be quickly synchronized with the input clock signal (CLKIN).

Figure 5:
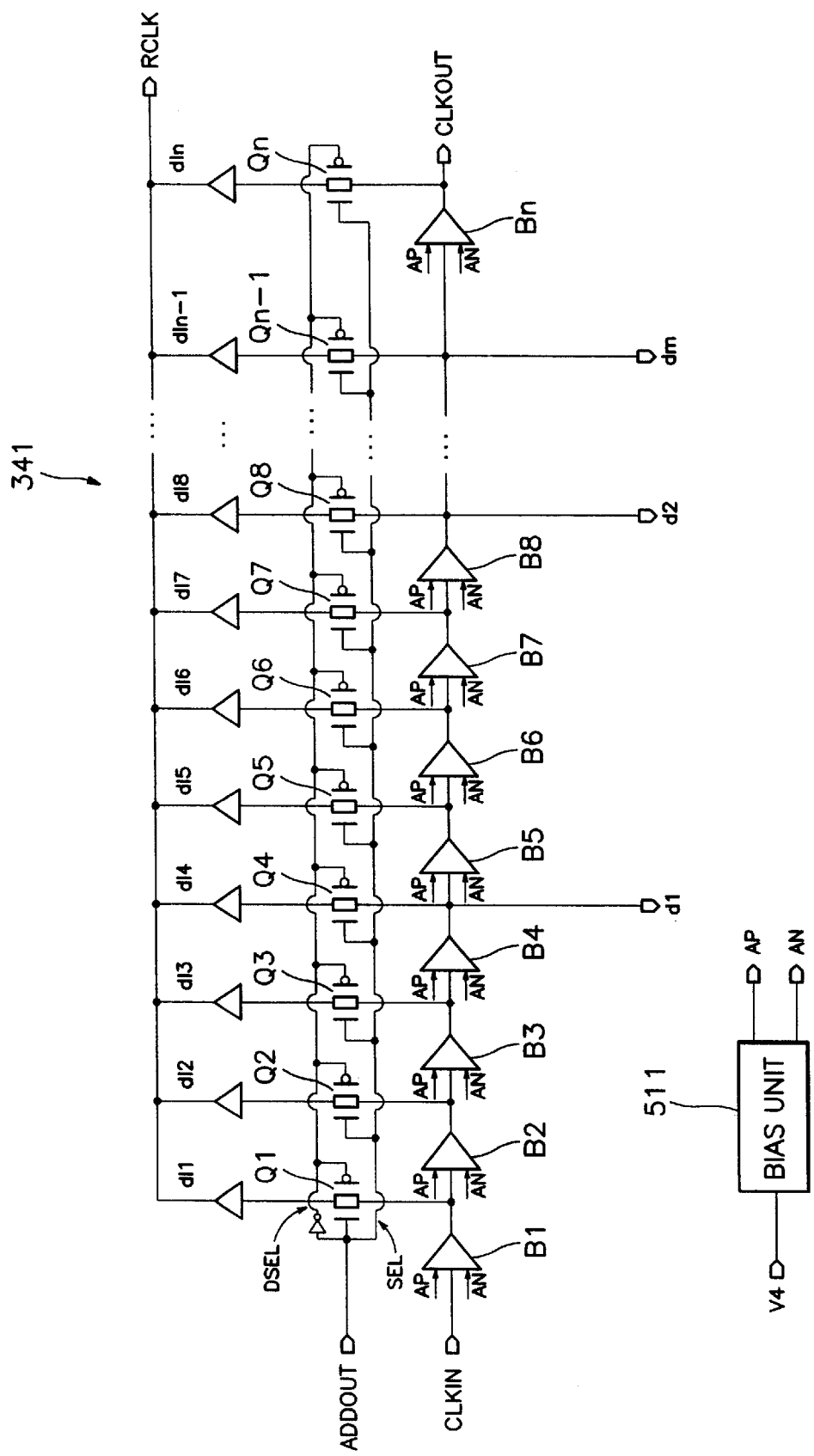
FIG. 5 shows in detail a delay unit shown in FIG. 3.

FIG. 5 shows in detail an embodiment of the delay unit 341 shown in FIG. 3. Referring to FIG. 5, the delay unit 341 includes multiple delay elements (B1~Bn), multiple switching elements (Q1~Qn-1) and a bias unit 511.

The multiple delay elements (B1~Bn) connected in series to the input clock signal (CLKIN) delay the input clock signal (CLKIN) for a pre-defined time and output the 1st multiple delay signals (d1~dm), the 2nd multiple delay signals (dl1~din) and the output clock signal (CLKOUT). Each of the 1st multiple delay signals (d1~dm) is output by specific delay elements, that is, every two delay elements, four delay elements or eight delay elements. Each of the 2nd multiple delay signals (dl1~din) is output by one delay element. Therefore, the number of 2nd multiple delay signals (dl1~din) is more than the number of 1st multiple delay signals (d1~dm). However, in some cases, the number of 1st multiple delay signals (d1~dm) can be equal to the number of 2nd multiple delay signals (dl1~din).

The multiple switching elements (Q1~Qn-1) are turned on or off depending on the output signal (ADDOUT) of the decoder 361. For example, if the switching elements (Q1~Qn-1) are transmission gates and one among the delay signals (dl1~din) is selected by an N-bit decoder to then be output as a clock signal (RCLK). In other words, the clock signal (RCLK) having an arbitrary phase delay can be produced according to the value of the N-bit decoder.

The bias unit changes the voltage level (bias level) of a 3rd signal (AP) or a 4th signal (AN) depending on the voltage of the signal (V4) of the filter 331, and the delay time is changed according to the voltage levels.

The number of delay elements (B1~Bn) is selected depending on the purpose of the DLL (301).

FIG. 6 is a circuit diagram of one embodiment of the harmonic lock preventing unit 311 shown in FIG. 3. Referring to FIG. 6, the harmonic lock preventing unit 311 includes multiple phase detectors (611~618), a 1st NOR gate through a 3rd NOR gate (621~623) and a 1st NAND gate 631.

The phase detectors 611 through 618 each receive two delay signals out of the 1st multiple delay signals (d1~dm) whose phase difference is small, as well as the input clock signal (CLKIN), and detect the phase difference of the received signals. The phase detectors 611 through 618 will be described in detail with reference to FIG. 7. The 1st NOR gate 621 and the 2nd NOR gate respectively receive outputs P1~P4 and P5~P8 of the phase detectors. The 3rd NOR gate 623 receives outputs P9 and P10 of the 1st NOR gate 621 and the 2nd NOR gate 622, and outputs the 1st signal (UP). The 1st NAND gate 631 receives outputs P9 and P10 of the 1st NOR gate and the 2nd NOR gate, and outputs the 2nd signal (DN).

The harmonic lock preventing unit 311 generates a phase error signal and activates the 1st signal (UP) or the 2nd signal (DN) when the delay time (t1) of the 1st multiple delay signals (d1~dm) exceeds the time defined in the following Formula 1.

$$t1 = \frac{T}{n} \times 4 \qquad \text{[Formula 1]}$$

Here, T is the period of the input clock signal (CLKIN) and n is the number of delay elements (B1~Bn) shown in FIG. 5. For example, if the period of the input clock signal (CLKIN) is 20[ns] and the number of the delay elements (B1~Bn) is 20, the delay time (t1) is 4[ns]. The reason why $$\left(\frac{T}{n}\right)$$

is multiplied by 4 is that the 1st multiple delay signals (d1~dm) are output by every fourth delay element. If the 1st multiple delay signals (d1~dm) were output by every second delay element, $$\left(\frac{T}{n}\right)$$

would be multiplied by 2. If the 1st multiple delay signals (d1~dm) were output by every eighth delay element, $$\left(\frac{T}{n}\right)$$

would be multiplied by 8.

Figure 7A:
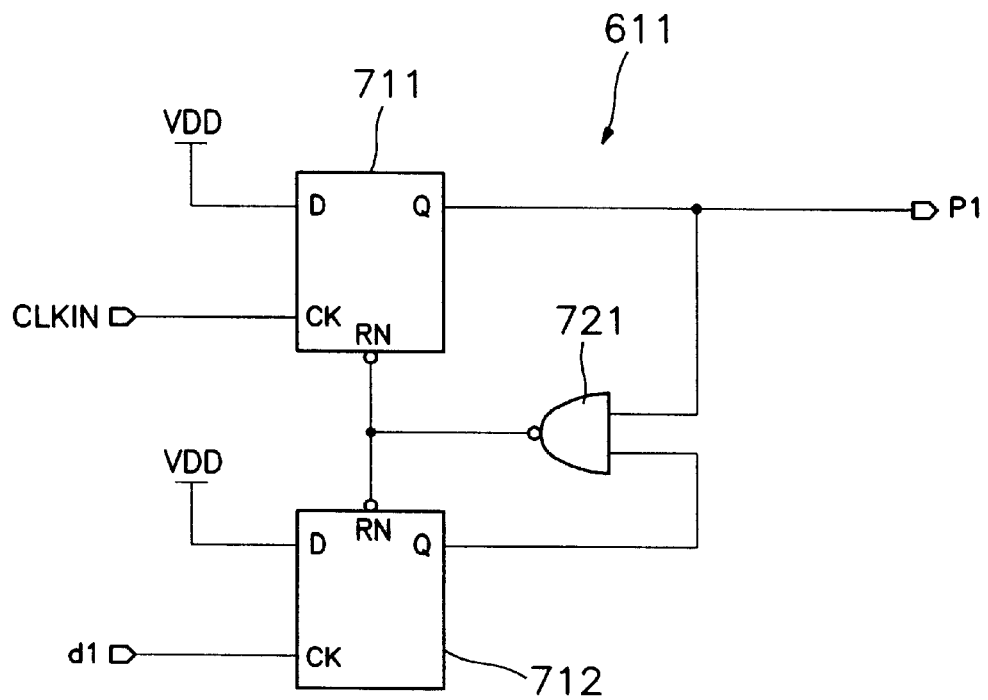
FIG. 7 is a circuit diagram of one of phase detectors shown in FIG. 6.
Figure 7B:
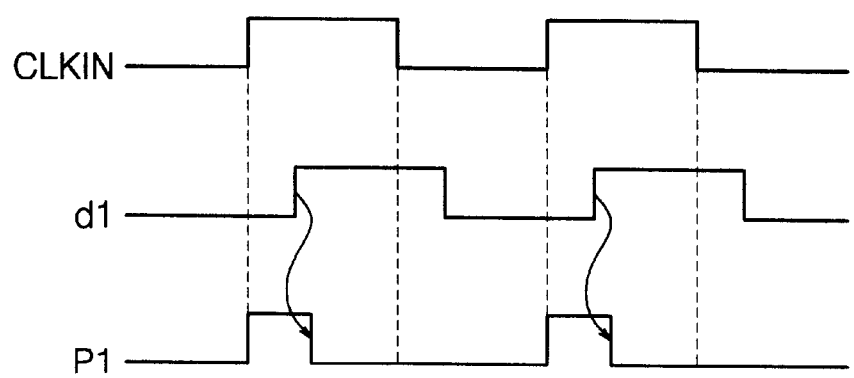

Referring to FIG. 7A and FIG. 7B, the phase detector 611 includes a 1st delay flip-flop 711, a 2nd delay flip-flop 712 and a 2nd NAND gate 721. The input clock signal (CLKIN) received by the 1st delay flip-flop 711 and the delay signal (d1) received by the 2nd delay flip-flop 712 have a phase difference. That is, the delay signal (d1) is delayed for more time than the input clock signal (CLKIN). The phase detector 611 generates a pulse signal (P1) having a pulse width corresponding to the delay time.

FIG. 8A through FIG. 8E show waveforms when the 1st multiple delay signals (d1~dm) shown in FIG. 5 are found to be unlocked.

If the respective periods of the 1st multiple delay signals (d1~dm) are greater than the period of input clock signal (CLKIN), the phase detectors 611 through 618 included in the harmonic lock preventing unit 311 detect the respectively delayed phase, generate the signals shown in FIGS. 8A and 8C, and transmit them to the 1st NOR gate 621 and the 2nd NOR gate 622. Then, the 1st NOR gate 621 generates the signal shown in FIG. 8B and the 2nd NOR gate 622 generates the signal shown in FIG. 8D. Because the outputs (P9, P10) of the 1st NOR gate 621 and the 2nd NOR gate 622 are combined by an OR gate 623, the 1st signal (UP) has the waveform shown in FIG. 8E. The electric charge pump 321 increases the voltage of the phase control signal (V2) and accelerates the operation of the delay elements (B1~Bn) of the delay unit 341. Then, the delay of the delay signals of the 1st multiple delay signals (d1~dm) and the output clock signal (CLKOUT) is reduced. The output clock signal (CLKOUT) is quickly synchronized with the input clock signal (CLKIN). That is, the output clock signal (CLKOUT) is prevented from entering the harmonic lock state.

Figure 8:
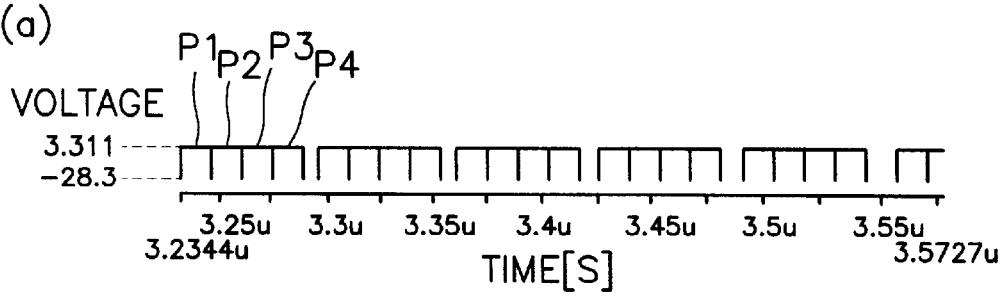
FIG. 8A through FIG. 8E show waveforms when delay signals of the unit delay shown in FIG. 5 are found to be unlocked.
Figure 8:
Figure 8:
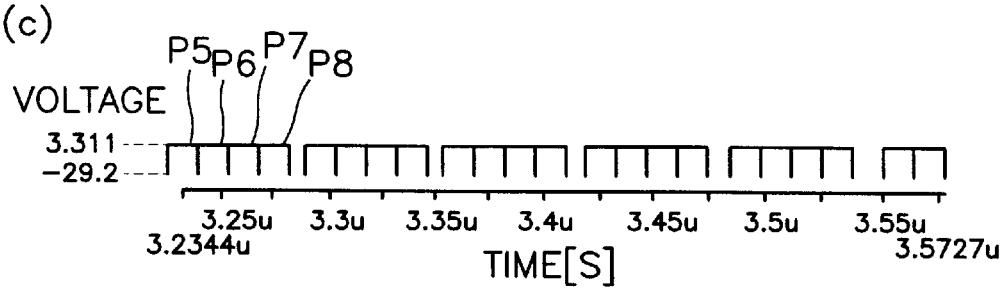
Figure 8:
Figure 8:
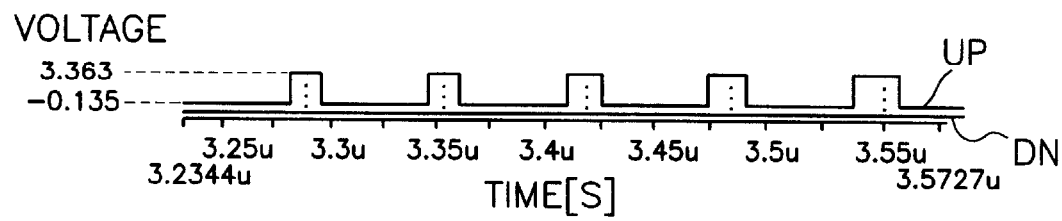
Figure 9:
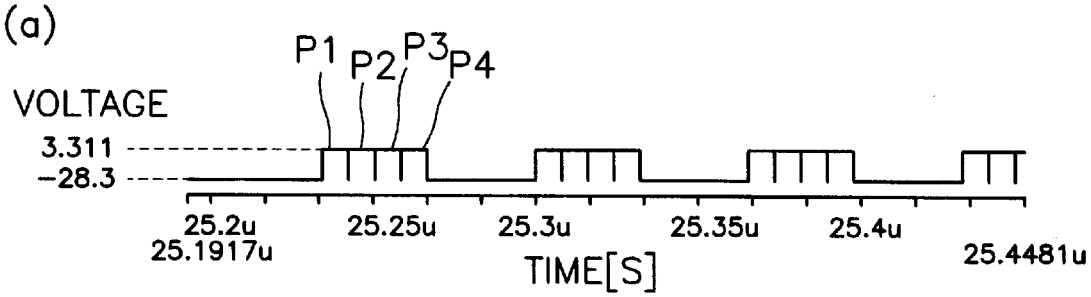
FIG. 9A through FIG. 9E show that the unlocked delay signals as shown in FIG. 8 are synchronized after passing through the harmonic lock preventing unit shown in FIG. 6.
Figure 9:
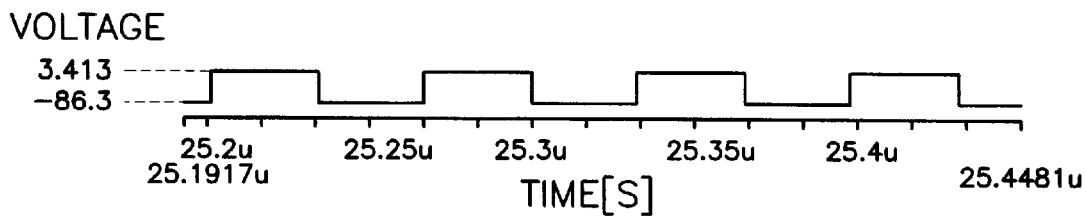
Figure 9:
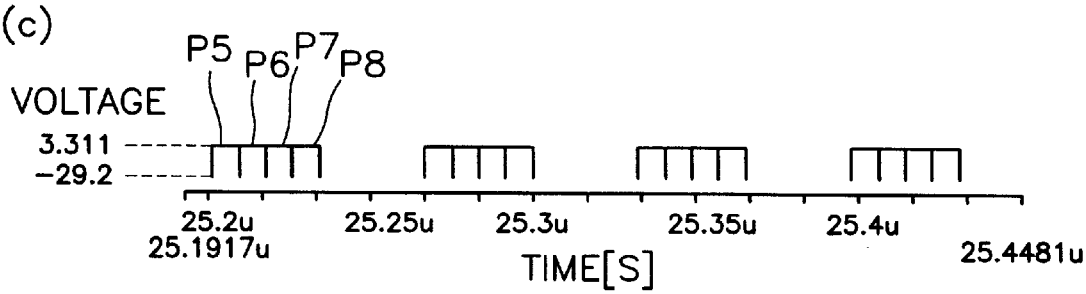
Figure 9:
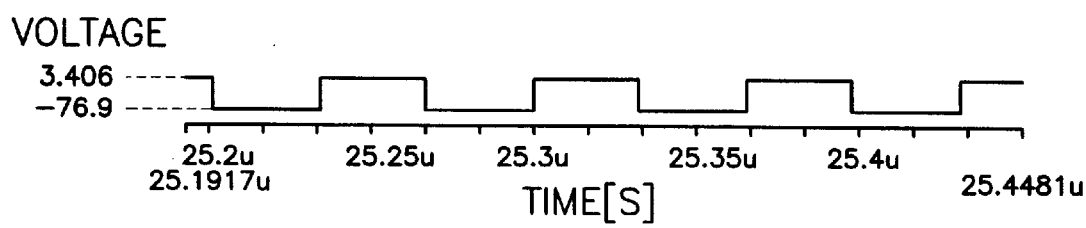
Figure 9:
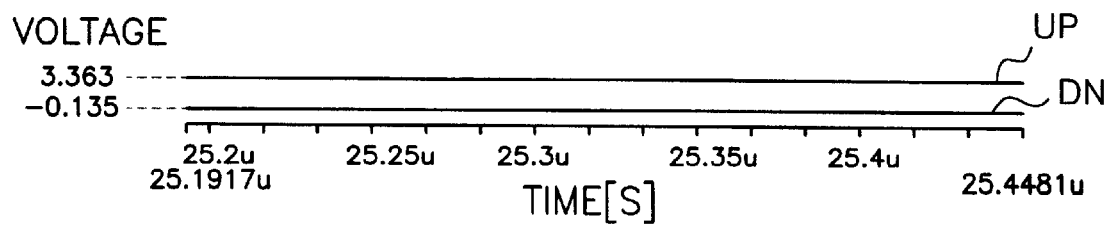

FIG. 9A through FIG. 9E show that the unlocked delay signals as shown in FIG. 8 are synchronized after passing through the harmonic lock preventing unit 311 shown in FIG. 6. As shown in FIG. 9A through FIG. 9E, if the phases and periods of the input clock signal (CLKIN) and the output clock signal (CLKOUT) are synchronized, the phase detectors 611 through 618 detect no phase error. Then, since the 1st signal (UP) is output as logic high, the voltage of the phase control signal (V2) is maintained.

As described above, according to the present invention, the delay unit 341 generates the 1st multiple delay signals (d1~dm). The harmonic lock preventing unit 311 detects the phases of the 1st multiple delay signals (d1~dm) and prevents the phase of the output clock signal (CLKOUT) from lagging. Therefore, the output clock signal (CLKOUT) is prevented from entering the harmonic lock state. In addition, the delay unit 341 generates the 2nd multiple delay signals (dl1~din). The decoder 361 selects some of the 2nd multiple delay signals (dl1~din) and the DLL user can selectively use the delay signals having different phases.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A delay locked loop comprising:
    a delay unit for receiving an input clock signal, generating an output clock signal whose phase lags that of the input clock signal, and generating multiple delay signals having differently delayed phases in response to the input clock signal;
    a harmonic lock preventing unit for receiving the input clock signal and the multiple delay signals, outputting a 1st signal and a 2nd signal, comparing the phases of the input clock signal and the multiple delay signals, and generating the 1st signal or the 2nd signal depending on the comparison result;
    an electric charge pump for receiving the 1st signal and the 2nd signal, generating a phase control signal, and making the voltage of the phase control signal higher or lower than a pre-defined voltage in response to the 1st signal and the 2nd signal;
    a filter for eliminating AC included in the phase control signal and transmitting the filtered signal to the delay unit; and
    a start-up circuit for feeding a 1st voltage to the electric charge pump in the initial state before the output clock signal is generated and making the electric charge pump provide a 2nd voltage to the delay unit,
    wherein the delay unit adjusts the phases of the output clock signal and the multiple delay signals in response to the phase control voltage.

2. The delay locked loop of claim 1, wherein the delay unit comprises:
    multiple delay elements connected in series for delaying the input clock signal and outputting the output clock signal and the multiple delay signals; and
    a bias unit for controlling the delay of the multiple delay elements depending on the voltage of the output signal of the filter.

3. The delay locked loop of claim 2, wherein the multiple delay signals are output from specific elements out of the multiple delay elements.

4. The delay locked loop of claim 1, wherein the harmonic lock preventing unit comprises:
    multiple phase detectors for receiving two adjacent signals out of the input clock signal and multiple delay signals which have the smallest phase gap;
    a 1st NOR gate and a 2nd NOR gate for each receiving the outputs of half of the multiple phase detectors;
    an OR gate for receiving the outputs of the 1st NOR gate and the 2nd NOR gate and outputting the 1st signal; and
    an AND gate for receiving the outputs of the 1st NOR gate and the 2nd NOR gate and outputting the 2nd signal.

5. The delay locked loop of claim 4, wherein the phase detectors comprise:
    a 1st delay flip-flop for receiving a power voltage and the input clock signal or the 1st delay signal and generating the output of the phase detector;
    a 2nd delay flip-flop for receiving the power voltage and a 2nd delay signal which has a phase closest to that of the 1st delay signal; and
    a 2nd NAND gate for receiving the outputs of the 1st delay flip-flop and the 2nd delay flip-flop, and providing the outputs to the 1st delay flip-flop and the 2nd delay flip-flop.

6. The delay locked loop of claim 1, wherein the harmonic lock preventing unit compares two adjacent signals out of the input clock signal and the multiple delay signals, and activates the 1st signal if the phase is found to lag and activates the 2nd signal if the phase is found to lead.

7. The delay locked loop of claim 6, wherein the electric charge pump makes the voltage of the phase control signal higher than the pre-defined voltage if the 1st signal is activated, and lower than the pre-defined voltage if the 2nd signal is activated.

8. The delay locked loop of claim 1, wherein the phases of the output clock signal and the multiple delay signals are advanced and delayed when the phase control voltage becomes higher and lower, respectively, than the pre-defined voltage.

9. The delay locked loop of claim 1, wherein the start-up circuit comprises:
    a 1st delay flip-flop for receiving the input clock signal and the output clock signal; and
    a 2nd delay flip-flop for receiving the outputs of the 1st delay flip-flop and the output clock signal and generating the output of the start-up circuit.

10. The delay locked loop of claim 1, wherein the electric charge pump includes a 1st transistor which outputs a power voltage generated by the output of the start-up circuit.

11. The delay locked loop of claims 9 and 10, wherein if the output clock signal is logic low in the initial state before the output clock signal is generated, the start-up circuit outputs logic low, the 1st transistor is turned on, and the power voltage is provided to the filter so that the output clock signal can be quickly synchronized with the input clock signal.

12. A delay locked loop comprising:

a delay unit for receiving an input clock signal, generating an output clock signal whose phase lags that of the input clock signal, and generating $1^{st}$ multiple delay signals and $2^{nd}$ multiple delay signals having differently delayed phases in response to the input clock signal;

a harmonic lock preventing unit for receiving the input clock signal and the $1^{st}$ multiple delay signals, outputting a $1^{st}$ signal and a $2^{nd}$ signal, comparing the phases of the input clock signal and the $1^{st}$ multiple delay signals, and generating the $1^{st}$ signal or the $2^{nd}$ signal depending on the comparison result;

an electric charge pump for receiving the $1^{st}$ signal and the $2^{nd}$ signal, generating a phase control signal, and making the voltage of the phase control signal higher or lower than a pre-defined voltage in response to the $1^{st}$ signal and the $2^{nd}$ signal;

a filter for eliminating AC included in the phase control signal and transmitting the filtered signal to the delay unit; and a decoder for decoding a received address signal and providing the decoded signal to the delay unit, wherein the delay unit selectively outputs some of the $2^{nd}$ multiple delay signals in response to the decoded signal adjusts the phases of the output clock signal and the $1^{st}$ multiple delay signals in response to the output signal of the filter.

13. The delay locked loop of claim 12, wherein the delay unit comprises:

multiple delay elements connected to the input clock signal in series;

a bias unit for controlling the delay of the multiple delay elements depending on the voltage of the output signal of the filter; and multiple switching elements, connected respectively to the outputs of the delay elements and switched by the decoded signal, for outputting the $2^{nd}$ multiple delay signals, wherein the $1^{st}$ multiple delay signals are output by specific elements out of the delay elements.

14. The delay locked loop of claim 13, wherein the switching elements are transmission gates.

15. The delay locked loop of claim 12, wherein the number of $2^{nd}$ multiple delay signals is bigger than the number of $1^{st}$ multiple delay signals.

16. A delay locked loop comprising:

a delay unit for receiving an input clock signal, generating an output clock signal whose phase lags that of the input clock signal, and generating $1^{st}$ and $2^{nd}$ multiple delay signals having differently delayed phases in response to the input clock signal;

a harmonic lock preventing unit for receiving the input clock signal and the $1^{st}$ multiple delay signals, outputting a $1^{st}$ signal and a $2^{nd}$ signal, comparing the phases of the input clock signal and the $1^{st}$ multiple delay signals, and generating the $1^{st}$ signal or the $2^{nd}$ signal depending on the comparison result;

an electric charge pump for receiving the $1^{st}$ signal and the $2^{nd}$ signal, generating a phase control signal, and making the voltage of the phase control signal higher or lower than a pre-defined voltage in response to the $1^{st}$ signal and the $2^{nd}$ signal;

a filter for eliminating AC included in the phase control signal and transmitting the filtered signal to the delay unit;

a start-up circuit for feeding a $1^{st}$ voltage to the electric charge pump in the initial state before the output clock signal is generated and making the electric charge pump provide a $2^{nd}$ voltage to the delay unit; and a decoder for decoding a received address signal and providing the decoded signal to the delay unit, wherein the delay unit outputs selectively some of the $2^{nd}$ multiple delay signals in response to the decoded signal and adjusts the phases of the output clock signal and the $1^{st}$ multiple delay signals in response to the output signal of the filter.

* * * * *

UNITED STATES PATENT AND TRADEMARK OFFICE
CERTIFICATE OF CORRECTION

PATENT NO. : 6,667,643 B2
DATED : December 23, 2003
INVENTOR(S) : Myeong-Lyong Ko It is certified that error appears in the above-identified patent and that said Letters Patent is hereby corrected as shown below:

<u>Title page,</u>
Item [76], Inventor, please delete "Myeong-Iyong Ko" and insert -- Myeong-Lyong Ko --.

Signed and Sealed this

Twenty-first Day of June, 2005

JON W. DUDAS
*Director of the United States Patent and Trademark Office*